(12) United States Patent
Noh et al.

(10) Patent No.: US 12,312,677 B2
(45) Date of Patent: May 27, 2025

(54) STEP COVERAGE USING AN INHIBITOR MOLECULE FOR HIGH ASPECT RATIO STRUCTURES

(71) Applicant: L'Air Liquide, Société Anonyme pour l'Etude et l'Exploitation des Procédés Georges Claude, Paris (FR)

(72) Inventors: Wontae Noh, Seoul (KR); Jooho Lee, Seoul (KR)

(73) Assignee: L'Air Liquide, Société Anonyme pour l'Etude et l'Exploitation des Procédés Georges Claude, Paris (FR)

(*) Notice: Subject to any disclaimer, the term of this patent is extended or adjusted under 35 U.S.C. 154(b) by 99 days.

(21) Appl. No.: 17/072,882

(22) Filed: Oct. 16, 2020

(65) Prior Publication Data

US 2022/0119939 A1    Apr. 21, 2022

(51) Int. Cl.
| | |
|---|---|
| *C23C 16/04* | (2006.01) |
| *C23C 16/44* | (2006.01) |
| *C23C 16/455* | (2006.01) |
| *H01L 21/02* | (2006.01) |

(52) U.S. Cl.
CPC ........ *C23C 16/045* (2013.01); *C23C 16/4408* (2013.01); *C23C 16/45534* (2013.01); *C23C 16/45536* (2013.01); *H01L 21/02271* (2013.01)

(58) Field of Classification Search
CPC ............. C23C 16/045; C23C 16/4408; C23C 16/45534; C23C 16/45536; H01L 21/02271
See application file for complete search history.

(56) References Cited

U.S. PATENT DOCUMENTS

| | | | |
|---|---|---|---|
| 9,564,312 B2 | 2/2017 | Henri et al. | |
| 2002/0076490 A1* | 6/2002 | Chiang | H01J 37/32449 257/E21.171 |
| 2007/0141779 A1 | 6/2007 | Abelson et al. | |
| 2009/0203222 A1 | 8/2009 | Dussarrat et al. | |
| 2011/0195574 A1 | 8/2011 | Blasco et al. | |
| 2016/0126101 A1* | 5/2016 | Ellinger | H01L 21/02178 438/586 |
| 2016/0148839 A1* | 5/2016 | Abelson | C23C 16/18 438/608 |

(Continued)

FOREIGN PATENT DOCUMENTS

| | | |
|---|---|---|
| KR | 10 2095710 | 4/2020 |
| WO | WO 2013 177284 | 11/2013 |
| WO | WO 2019 005433 | 1/2019 |

OTHER PUBLICATIONS

International Search Report and Written Opinion for corresponding PCT/US2021/054655.

(Continued)

*Primary Examiner* — Michael G Miller
(74) *Attorney, Agent, or Firm* — Yan Jiang

(57) ABSTRACT

Disclosed is a method for improving step coverage of a film deposited on high aspect ratio (HAR) apertures in a substrate. The method comprises i) sequentially or simultaneously exposing the substrate to a vapor of an inhibitor, a vapor of a precursor and a vapor of a co-reactant; and ii) allowing the film with a desired step coverage being deposited on the surface of the HAR apertures through a vapor deposition process, wherein the inhibitor contains O, N, S, P, B, C, F, Cl, Br, or I.

15 Claims, 6 Drawing Sheets

(56) References Cited

U.S. PATENT DOCUMENTS

| | | | |
|---|---|---|---|
| 2017/0040172 A1 | 2/2017 | Moon et al. | |
| 2017/0298511 A1* | 10/2017 | Lansalot-Matras | C07F 9/00 |
| 2020/0017967 A1* | 1/2020 | Abel | C23C 16/52 |
| 2020/0279757 A1* | 9/2020 | Kumakura | H01L 21/67069 |
| 2021/0062338 A1* | 3/2021 | Yeon | C23C 16/4408 |
| 2021/0130954 A1* | 5/2021 | Lee | C23C 16/0272 |
| 2021/0327708 A1 | 10/2021 | Hong et al. | |

OTHER PUBLICATIONS

Talukdar, T.K., Coating and filling of nanometer-scale structures using chemical vapor deposition, 2018, Univ. of Illinois at Urbana-Champaign, PhD dissertation, 198 pages.

Zydor, A et al., 'TiCp*(OMe)$_3$ versus Ti(OMe)$_4$ in atomic layer deposition of TiO2 with water—ab initio modelling of atomic layer deposition surface reactions, Journal of Nanoscience and Nanotechnology, vol. 11, 2011, 8089-8093.

* cited by examiner

STEP COVERAGE USING AN INHIBITOR MOLECULE FOR HIGH ASPECT RATIO STRUCTURES

TECHNICAL FIELD

Disclosed are methods for improving step coverage using an inhibitor molecule for high aspect ratio structures in semiconductor applications. In particular, the disclosed methods relates to vapor deposition processes using organometallic precursors and the inhibitors containing O, N, S, P, B, C, F, Cl, Br, or I to improve step coverage.

BACKGROUND

Deposition process is an important process for depositing a material on a substrate. As a device sizes continue to be scaled down in semiconductors, step coverage is a key factor of integration for high aspect ratio (HAR) structures.

For example, a narrow and deep trench is formed in a semiconductor substrate and a gap fill is performed using an insulating material to form an insulating film to be sequentially deposited from the bottom surface of the trench so that the trench is completely covered. Deposition onto HAR stepped surfaces faces the challenge of non-uniform gap filling, which may produce a poor step coverage and may contain voids and/or weakpoints.

There are various attempts to improve the step coverage.

US 20070141779 to Abelson et al. discloses methods for coating and filling high aspect ratio (HAR) recessed features and conformally or superconformally coating and/or uniformly filling structures with a continuous, conformal layer or superconformal layer, in which a bottom up growth of $CrB_2$ film is deposited on a trench substrate with a help of hydrogen plasma as a suppressor by conventional chemical vapor deposition (CVD) methods.

U.S. Pat. No. 9,564,312 to Henri et al. discloses selective inhibition in atomic layer deposition (ALD) of silicon-containing films, e.g., $SiN_x$ film. The selective inhibition involves an exposure of an adsorbed layer of a silicon-containing precursor to a hydrogen-containing inhibitor, prior to the exposure of the adsorbed layer to a second reactant. The exposure to a hydrogen-containing inhibitor may be performed with a plasma.

U.S. Ser. No. 10/103,026 and US 20170040172 to Moon et al. discloses methods of forming a material layer, and more particularly, methods of forming a material layer, by which a material layer having good step coverage may be stably manufactured despite variations in other process parameters.

Talukdar T K (Doctoral dissertation, University of Illinois at Urbana-Champaign, 2018) discloses coating and filling of nanometer-scale structure using CVD, in which oxide is used to afford bottom-up filling of trenches by superconformal CVD method.

KR102095710 to Jin et al. discloses a method for forming a thin film using a surface protection material to achieve a good step coverage, which comprises a surface protection material supply step of supplying the surface protection material to adsorb the same on the substrate.

In the semiconductor process field, development of a process having good step coverage has attracted attention, and use of atomic layer deposition (ALD) processes has received specific attention.

SUMMARY

Disclosed is a method for improving step coverage of a film deposited on high aspect ratio (HAR) apertures in a substrate, the method comprising:

i) sequentially or simultaneously exposing the substrate to a vapor of an inhibitor, a vapor of a precursor and a vapor of a co-reactant; and
ii) allowing the film with a desired step coverage being deposited on the surface of the HAR apertures through a vapor deposition process, wherein the inhibitor contains O, N, S, P, B, C, F, Cl, Br, or I.

The disclosed method may include one or more of the following aspects:
- further comprising maintaining a temperature of the substrate in a range of from room temperature to 650° C.;
- the inhibitor being selected from one or more of
  a) oxygen based aliphatic and aromatic inhibitors including alcohols, diols, ethers, epoxides, aldehydes, ketones, carboxylic acids, enols, esters, anhydrides, phenols, substituted phenols;
  b) nitrogen based aliphatic and aromatic inhibitors including amines, imines, imides, amides, azides, cyanates, nitrile, nitrate, nitrite, nitrogen containing heterocycles;
  c) sulfur based aliphatic and aromatic inhibitors including thiols, sulfides, disulfide, sulfoxide, sulfone, thiocyanates, isothiocyanates, thioesters;
  d) phosphorus based aliphatic and aromatic inhibitors including phosphines, phosphonic acid, phosphodiesters;
  e) boron based aliphatic and aromatic inhibitors including boronic acid, boronic ester, borinic esters; carbon based aliphatic inhibitors including alkanes, alkenes, alkynes and benzene derivatives;
  f) halide containing organic molecules and inorganic halides including $I_2$; or
  g) $H_2O$ vapor, $H_2$ gas, CO gas, CS gas and nitrogen oxide ($NO_x$) gases;
  h) and combinations of a)-g);
- the inhibitor being a radical form of a vapor or gas of the inhibitor at a temperature ranging from room temperature to approximately 650° C. generated with or without plasma;
- the inhibitor being selected from tetrahydrofuran (THF), dimethoxyethane (DME) or triethylamine (TEA);
- the inhibitor being THF;
- the inhibitor being DME;
- the inhibitor being TEA;
- the precursor being an organometallic precursor selected from alkylamino and cyclopentadienyl derivatives of transition metals and main group elements that contain homoleptic or heteroleptic ligands selected from alkylamines, alkoxy, amidinates, or halides;
- the transition metals and main group elements being selected from Hf, Zr, Nb, Ti, lanthanides, rare earths, Al or Si;
- the precursor being $ZrCp(NMe_2)_3$;
- the co-reactant being $O_3$, $O_2$, $H_2O$, $H_2O_2$, $D_2O$, alcohols, $NH_3$, $N_2$, $N_2H_2$, $H_2$, or radicals thereof generated by plasma;
- the co-reactant being $O_3$ or $O_3$ radicals generated by plasma;
- the desired step coverage being ≥100%;
- the desired step coverage being larger than the step coverage with the absence of the inhibitor;
- the HAR ranging from 25:1 to 200:1;
- the substrate being a patterned or 3D structure;
- the aperture being a hole, a via, a trench, a gap or an opening formed in the substrate from a previous manufacturing step;

the films deposited on the HAR structures being metal films, metal oxide films, silicon-containing films, alloys, and so on;

the film deposited on the HAR structures being $ZrO_2$;

the vapor deposition process being ALD, CVD or combination thereof;

the vapor deposition process being a spatial ALD, a thermal ALD, a plasma enhanced ALD and a plasma enhanced CVD;

the vapor deposition process being a spatial ALD;

the vapor deposition process being a thermal ALD;

the vapor deposition process being a plasma enhanced ALD;

the vapor deposition process being a plasma enhanced CVD;

an order of exposing the substrate to the inhibitor, the precursor and the co-reactant including
i) the inhibitor, the precursor and the co-reactant sequentially;
ii) the precursor, the inhibitor and the co-reactant sequentially;
iii) the precursor, the co-reactant and the inhibitor sequentially; or
iv) the inhibitor and the precursor simultaneously and then the co-reactant;

an order of exposing the substrate to the inhibitor, the precursor and the co-reactant being the inhibitor, the precursor and the co-reactant sequentially;

an order of exposing the substrate to the inhibitor, the precursor and the co-reactant being the precursor, the inhibitor and the co-reactant sequentially;

an order of exposing the substrate to the inhibitor, the precursor and the co-reactant being the precursor, the co-reactant and the inhibitor sequentially;

an order of exposing the substrate to the inhibitor, the precursor and the co-reactant being the inhibitor and the precursor simultaneously and then the co-reactant; and further comprising
purging and removing one or more of an excess inhibitor, an excess precursor and an excess co-reactant after each exposure using a purge gas,
wherein the purge gas is an inert gas selected from $N_2$, Ar, Kr or combinations thereof.

Also disclosed is a method for improving step coverage of a $ZrO_2$ film deposited on apertures therein with an aspect ratio of about 20:1 to about 25:1 in a substrate, the method comprising:
i) exposing the substrate to a vapor of an inhibitor selected from tetrahydrofuran (THF), dimethoxyethane (DME) or triethylamine (TEA);
ii) exposing the substrate to a vapor of a precursor $ZrCp(NMe_2)_3$;
iii) exposing the substrate to a vapor of a co-reactant $O_3$; and
iv) repeating the steps of i) to iii) until a desired step coverage of the $ZrO_2$ film deposited on the apertures is formed through an ALD process in a temperature ranging from 200° C. to 400° C.,
wherein, after each exposure, excess inhibitor, excess precursor and excess co-reactant is purged and removed using $N_2$, respectively.

Notation and Nomenclature

The following detailed description and claims utilize a number of abbreviations, symbols, and terms, which are generally well known in the art, and include:

As used herein, the indefinite article "a" or "an" means one or more.

As used herein, "about" or "around" or "approximately" in the text or in a claim means ±10% of the value stated.

As used herein, "room temperature" in the text or in a claim means from approximately 20° C. to approximately 25° C.

As used in the disclosed embodiments, the term "independently" when used in the context of describing R groups should be understood to denote that the subject R group is not only independently selected relative to other R groups bearing the same or different subscripts or superscripts, but is also independently selected relative to any additional species of that same R group. For example in the formula $MR^1_x(NR^2R^3)_{(4-x)}$, where x is 2 or 3, the two or three $R^1$ groups may, but need not be identical to each other or to $R^2$ or to $R^3$. Further, it should be understood that unless specifically stated otherwise, values of R groups are independent of each other when used in different formulas.

The standard abbreviations of the elements from the periodic table of elements are used herein. It should be understood that elements might be referred to by these abbreviation (e.g., Si refers to silicon, N refers to nitrogen, O refers to oxygen, C refers to carbon, H refers to hydrogen, F refers to fluorine, etc.).

As used herein, the abbreviation "Me" refers to a methyl group; the abbreviation "Et" refers to an ethyl group; the abbreviation "Pr" refers to a propyl group (i.e., n-propyl or isopropyl); the abbreviation "iPr" refers to an isopropyl group; the abbreviation "Bu" refers to any butyl group (n-butyl, iso-butyl, tert-butyl, sec-butyl); the abbreviation "tBu" refers to a tert-butyl group; the abbreviation "sBu" refers to a sec-butyl group; the abbreviation "iBu" refers to an iso-butyl group; the abbreviation "Ph" refers to a phenyl group.

The term "substrate" refers to a material or materials on which a process is conducted. The substrate may refer to a wafer having a material or materials on which a process is conducted. The substrates may be any suitable wafer used in semiconductor, photovoltaic, flat panel, or LCD-TFT device manufacturing. The substrate may also have one or more layers of differing materials already deposited upon it from a previous manufacturing step. For example, the wafers may include silicon layers (e.g., crystalline, amorphous, porous, etc.), silicon containing layers (e.g., $SiO_2$, SiN, SiON, SiCOH, etc.), metal containing layers (e.g., copper, cobalt, ruthenium, tungsten, platinum, palladium, nickel, ruthenium, gold, etc.), an organic layer such as amorphous carbon, or a photoresist, or combinations thereof. Furthermore, the substrate may be planar or patterned. The substrate may include layers of oxides which are used as dielectric materials in MEMS, 3D NAND, MIM, DRAM, or FeRam device applications (for example, $ZrO_2$ based materials, $HfO_2$ based materials, $TiO_2$ based materials, rare earth oxide based materials, ternary oxide based materials, etc.) or nitride-based films (for example, TaN, TiN, NbN) that are used as electrodes. One of ordinary skill in the art will recognize that the terms "film" or "layer" used herein refer to a thickness of some material laid on or spread over a surface and that the surface may be a trench or a line. Throughout the specification and claims, the wafer and any associated layers thereon are referred to as substrates.

The term "wafer" or "patterned wafer" refers to a wafer having a stack of silicon-containing films on a substrate and a patterned hardmask layer on the stack of silicon-containing films formed for pattern etch. The term "wafer" or "patterned wafer" may also refers to a trench wafer having an aspect ratio.

The term "aspect ratio" refers to a ratio of the height of a trench (or aperture) to the width of the trench (or the diameter of the aperture).

Note that herein, the terms "film" and "layer" may be used interchangeably. It is understood that a film may correspond to, or related to a layer, and that the layer may refer to the film. Furthermore, one of ordinary skill in the art will recognize that the terms "film" or "layer" used herein refer to a thickness of some material laid on or spread over a surface and that the surface may range from as large as the entire wafer to as small as a trench or a line.

Note that herein, the terms "aperture", "gap", "via", "hole", "opening", "trench" and "structure" may be used interchangeably to refer to an opening formed in a semiconductor substrate.

Note that herein, the terms "deposition temperature", "substrate temperature" and "process temperature" may be used interchangeably. It is understood that a substrate temperature may correspond to, or be related to a deposition temperature or a process temperature, and that the deposition temperature or process temperature may refer to the substrate temperature.

Note that herein, the terms "precursor" and "deposition compound" and "deposition gas" may be used interchangeably when the precursor is in a gaseous state at room temperature and ambient pressure. It is understood that a precursor may correspond to, or be related to a deposition compound or deposition gas, and that the deposition compound or deposition gas may refer to the precursor.

As used herein, the abbreviation "NAND" refers to a "Negated AND" or "Not AND" gate; the abbreviation "2D" refers to 2 dimensional gate structures on a planar substrate; the abbreviation "3D" refers to 3 dimensional or vertical gate structures, wherein the gate structures are stacked in the vertical direction.

The term "inhibitor" used herein refers to a modifier, a suppressor or a promoter, etc., which includes concepts of inhibition, suppression or promotion to improve the step coverage. The inhibitor is an additive or an inserted chemical during vapor deposition processes, which is removed after depositing a film. The inhibitor enhances conformality of a film deposited on a HAR structure and/or helps to remove voids or weakpoints in a gapfill application. The thickness of the inhibitor on the HAR structure may be from about 0.5 nm to about 20 nm. In one case, the thickness of the inhibitor on the HAR structure may be from about 0.5 nm to about 5.0 nm. Alternatively, the thickness of the inhibitor on the HAR structure may be a very thin layer, possibly one monolayer or less.

Please note that the silicon-containing films, such as SiN and SiO, are listed throughout the specification and claims without reference to their proper stoichiometry. The silicon-containing films may include pure silicon (Si) layers, such as crystalline Si, poly-silicon (p-Si or polycrystalline Si), or amorphous silicon; silicon nitride ($Si_kN_l$) layers; or silicon oxide ($Si_nO_m$) layers; or mixtures thereof, wherein k, l, m, and n, inclusively range from 0.1 to 6. Preferably, silicon nitride is $Si_kN_l$, where k and l each range from 0.5 to 1.5. More preferably silicon nitride is $Si_3N_4$. Herein, SiN in the following description may be used to represent $Si_kN_l$ containing layers. Preferably silicon oxide is $Si_nO_m$, where n ranges from 0.5 to 1.5 and m ranges from 1.5 to 3.5. More preferably, silicon oxide is $SiO_2$. Herein, SiO in the following description may be used to represent $Si_nO_m$ containing layers. The silicon-containing film could also be a silicon oxide based dielectric material such as organic based or silicon oxide based low-k dielectric materials such as the Black Diamond II or III material by Applied Materials, Inc. with a formula of SiOCH. Silicon-containing film may also include $Si_aO_bN_c$ where a, b, c range from 0.1 to 6. The silicon-containing films may also include dopants, such as B, C, P, As and/or Ge.

Ranges may be expressed herein as from about one particular value, and/or to about another particular value. When such a range is expressed, it is to be understood that another embodiment is from the one particular value and/or to the other particular value, along with all combinations within said range. Any and all ranges recited in the disclosed embodiments are inclusive of their endpoints (i.e., x=1 to 4 or x ranges from 1 to 4 includes x=1, x=4, and x=any number in between), irrespective of whether the term "inclusively" is used.

Reference herein to "one embodiment" or "an embodiment" means that a particular feature, structure, or characteristic described in connection with the embodiment may be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

As used in this application, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion.

"Comprising" in a claim is an open transitional term which means the subsequently identified claim elements are a nonexclusive listing i.e. anything else may be additionally included and remain within the scope of "comprising." "Comprising" is defined herein as necessarily encompassing the more limited transitional terms "consisting essentially of" and "consisting of"; "comprising" may therefore be replaced by "consisting essentially of" or "consisting of" and remain within the expressly defined scope of "comprising".

Additionally, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

BRIEF DESCRIPTION OF THE DRAWINGS

For a further understanding of the nature and objects of the present invention, reference should be made to the following detailed description, taken in conjunction with the accompanying drawings, in which like elements are given the same or analogous reference numbers and wherein.

DESCRIPTION OF PREFERRED EMBODIMENTS

Figure 2:
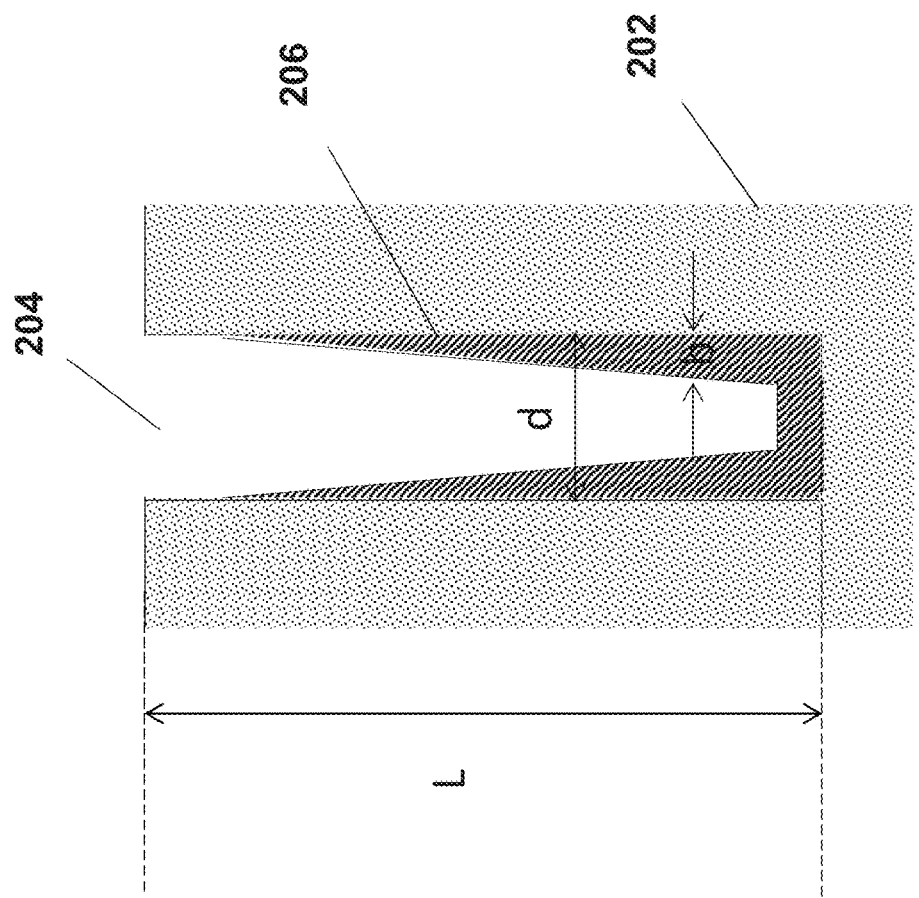
FIG. 2 is a schematic diagram showing the inhibitor effect on step coverage of a HAR aperture with an inhibitor according to the disclosed methods.

Disclosed are methods or processes for using inhibitors in addition to precursors to improve step coverage of high aspect ratio (HAR) structures in semiconductor applications. The disclosed methods include vapor deposition processes involving the inhibitors to improve step coverage. Furthermore, the disclosed methods include ALD processes involving the inhibitors to improve step coverage. The disclosed inhibitors include concepts of deposition inhibition, suppression or promotion to improve the resulting step coverage. More specifically, the disclosed methods include a selection of inhibitor molecules and inhibitor doses to improve the step coverage, to prevent overhang films in the HAR structures, so called "pinch off", and to prevent voids and/or weakpoints formed in the deposited films. The HAR structures include HAR apertures, gaps, holes, vias, trenches, openings and the like, manufactured in a substrate from a previous manufacturing process. The substrate generally has one or more layers of differing materials already deposited upon it from a previous manufacturing process.

The disclosed precursors may be organometallic precursors. More specifically, the disclosed precursors may include alkylamino and cyclopentadienyl derivatives of transition metals and main group elements that contain homoleptic or heteroleptic ligands selected from alkylamines, alkoxy, amidinates, or halides. The transition metals and main group elements may be Hf, Zr, Nb, Ti, lanthanides, rare earths, Al, Si, and so on. The disclosed precursors are suitable for the vapor deposition processes.

The disclosed deposition precursors include typical and well-known precursors applied to the vapor depositions, for example, $M(CpR)(NMe_2)_3$, wherein M=Group 4 element, R=H, $C_1$-$C_4$ alkyls;

$M(CpR)(OMe)_3$, wherein M=Group 4 element, R=H, $C_1$-$C_4$ alkyls;

$M(=NtBu)(NR_2)_3$, wherein M=Group 5 element, R=$C_1$-$C_4$ alkyls;

$M(=NtBu)(RCp)(NR'_2)_3$, wherein M=Group 5 element, R=R'=$C_1$-$C_4$ alkyls;

$M(NR_2)_5$, wherein M=Group 5 element, R=$C_1$-$C_4$ alkyls;

$AlR_3$, wherein R=$C_1$-$C_4$ alkyls;

$Ln(RCp)_3$, wherein Ln=Lanthanide elements, R=$C_1$-$C_4$ alkyls;

$Ln(RCp)_2$(R'-amd), wherein Ln=Lanthanide elements, R=R'=$C_1$-$C_4$ alkyls;

$Ln(NR_2)_3$, wherein Ln=Lanthanide elements, R=$C_1$-$C_4$ alkyls;

hexacarbonyl(3,3-dimethyl-1-butyne)dicobalt (CCTBA, CAS No.: 56792-69-9);

$Ru(RCp)_2$, wherein R=$C_1$-$C_4$ alkyls;

$Ru(R$-cyclohexadiene$)(CO)_3$, wherein R=$C_1$-$C_4$ alkyls;

compounds of oxygen and chlorine with molybdenum $MoO_xCl_y$; and other Si-containing precursors.

Exemplary examples of the disclosed deposition precursors include $HfCp(NMe_2)_3$, $ZrCp(NMe_2)_3$, $NbCp(NMe_2)_3$, and $TiCp(NMe_2)_3$.

The most important feature of the disclosed inhibitor deposition methods is a selection of the inhibitor. The inhibitor should not react with a precursor that is used in the deposition process and should be physisorbed on the surface of HAR structures yet not so strongly (mild absorption), so that the physisorbed inhibitor may be subsequently purged and removed by a following purge step. In addition, in order to avoid any unnecessary reactions with an incoming co-reactant, the inhibitor dose and the following purge steps should be separated from the precursor dose and purge steps. In a HAR structure, the inhibitor layer may form a vertical gradient adsorption along the aperture, high adsorption near to the top entrance, low adsorption deep at the bottom (see FIG. 1), which may compete with the incoming precursors for active binding sites of the surface, resulting in an improved step coverage and/or a perfect step coverage, for example, a step coverage of ≥100%.

The disclosed inhibitors may contain O, N, S, P, B, C, or a halogen element (e.g., F, Cl, Br, I).

The disclosed inhibitors include oxygen based inhibitors, nitrogen based inhibitors, sulfur based inhibitors, phosphorus based inhibitors, boron based inhibitors, carbon based inhibitors, halide containing organic molecules and inorganic halides, $H_2O$ vapor, $H_2$ gas, CO gas, CS gas, nitrogen oxide ($NO_x$) gases, and any radical forms of gases at room temperature or higher.

The disclosed oxygen based inhibitors include aliphatic and aromatic inhibitors, such as, alcohols, diols, ethers, epoxides, aldehydes, ketones, carboxylic acids, enols, esters, anhydrides, phenols, substituted phenols, and the like. Exemplary examples of the disclosed oxygen based inhibitors include tetrahydrofuran (THF), dimethoxyethane (DME), diethylether and dioxane.

The disclosed nitrogen based inhibitors include aliphatic and aromatic inhibitors, such as, amines, imines, imides, amides, azides, cyanates, nitrile, nitrate, nitrite, nitrogen containing heterocycles, and the like. Exemplary examples of the disclosed nitrogen based inhibitors include triethylamine (TEA), trimethylamine, tetramethylethylenediamine (TMEDA) and $NH_3$.

The disclosed sulfur based inhibitors include aliphatic and aromatic inhibitors, such as, thiols, sulfides, disulfide, sulfoxide, sulfone, thiocyanates, isothiocyanates, thioesters, and the like. Exemplary examples of the disclosed sulfur based inhibitors include $H_2S$, $Me_2S$, $Et_2S$, $Me_2S$—$SMe_2$ and $Et_2S$—$SEt_2$.

The disclosed phosphorus based inhibitors include aliphatic and aromatic inhibitors, such as, phosphines, phosphonic acid, phosphodiesters, and the like. Exemplary examples of the disclosed phosphorus based inhibitors include $PH_3$, $PMe_3$ and $P(OMe)_3$.

The disclosed boron based inhibitors include aliphatic and aromatic inhibitors, such as, boronic acid, boronic ester, borinic esters, and the like. Exemplary examples of the disclosed boron based inhibitors include $BMe_3$, $BEt_3$, borazine, $B(OMe)_3$ and $B(OEt)_3$.

The disclosed carbon based inhibitors include aliphatic inhibitors, such as, alkanes, alkenes, alkynes and benzene derivatives, and the like. Exemplary examples of the disclosed carbon based inhibitors include acetylene and alkene.

The disclosed halide containing organic molecules and inorganic halides include $I_2$.

The disclosed inhibitors may be radical forms of gases at room temperature. The disclosed inhibitors are any radical forms of gases at a temperature range from room temperature to approximately 650° C.; preferably, the disclosed inhibitors are compounds that may interact with surface having relatively high electron negativity or lone pair electrons. For example, THF, DME, TEA, and the like.

Purity of the disclosed precursors and inhibitors is greater than 95% w/w (i.e., 95.0% w/w to 100.0% w/w), preferably greater than 98% w/w (i.e., 98.0% w/w to 100.0% w/w), and more preferably greater than 99% w/w (i.e., 99.0% w/w to 100.0% w/w). One of ordinary skill in the art will recognize that the purity may be determined by H NMR and gas liquid chromatography with mass spectrometry. The disclosed precursors and inhibitors may contain impurities of organic, inorganic and metal-containing molecules. The total quantity of these impurities is preferably below 5% w/w (i.e., 0.0% w/w to 5.0% w/w), preferably below 2% w/w (i.e., 0.0% w/w to 2.0% w/w), and more preferably below 1% w/w (i.e., 0.0% w/w to 1.0% w/w). The disclosed precursors and inhibitors may be purified by recrystallisation, sublimation, distillation, and/or passing the gas liquid through a suitable adsorbent, such as a 4 Å molecular sieve.

Purification of the disclosed precursors and inhibitors may also result in metal impurities at the 0 ppbw to 1 ppmw, preferably 0-500 ppbw (part per billion weight) level. These metal impurities may include, but are not limited to, Aluminum (Al), Arsenic (As), Barium (Ba), Beryllium (Be), Bismuth (Bi), Cadmium (Cd), Calcium (Ca), Chromium (Cr), Cobalt (Co), Copper (Cu), Gallium (Ga), Germanium (Ge), Hafnium (Hf), Zirconium (Zr), Iron (Fe), Lead (Pb), Lithium (Li), Magnesium (Mg), Manganese (Mn), Tungsten (W), Nickel (Ni), Potassium (K), Sodium (Na), Strontium (Sr), Thorium (Th), Tin (Sn), Titanium (Ti), Uranium (U), Zinc (Zn) and the like.

In addition to the disclosed precursors and inhibitors, a co-reactant may be used. The co-reactant may be $O_3$, $O_2$, $H_2O$, $H_2O_2$, $D_2O$, alcohols, $NH_3$, $N_2$, $N_2H_2$, $H_2$, radicals thereof. Preferably, the co-reactant is $O_3$ or $NH_3$. Preferably, the radicals are any radical forms of gases generated by plasma formed at room temperature or above. For an ALD process without plasma involved, the radical of the co-reactant may be formed prior to introducing the co-reactant into the reactor. Preferably, the co-reactant is a gas or in a vapor form. In case a liquid co-reactant is used, the vapor form of the co-reactant needs to be produced prior to introducing the co-reactant to a reactor. A co-reactant and an inhibitor may be the same molecule such as ammonia. For example, ammonia may be used with a metalorganic precursor as a co-reactant for forming SiNx films, and then the ammonia used in a separate step in a deposition sequence as an inhibitor.

Purity of the disclosed co-reactant is greater than 95% v/v or by volume (i.e., 95.0% v/v to 100.0% v/v), preferably greater than 98% v/v (i.e., 98.0% v/v to 100.0% v/v), and more preferably greater than 99% v/v (i.e., 99.0% v/v to 100.0% v/v). One of ordinary skill in the art will recognize that the purity may be determined by H NMR and gas liquid chromatography with mass spectrometry. The disclosed co-reactants may contain impurities of organic molecules. The total quantity of these impurities is preferably below 5% v/v (i.e., 0.0% v/v to 5.0% v/v), preferably below 2% v/v (i.e., 0.0% v/v to 2.0% v/v), and more preferably below 1% v/v (i.e., 0.0% v/v to 1.0% v/v). The disclosed co-reactants may be purified by distillation and/or passing the gas liquid through a suitable adsorbent, such as a 4 Å molecular sieve.

The disclosed deposition methods may be used to deposit films on high aspect ratio structures using any deposition methods known to those of skill in the art. Examples of suitable vapor deposition methods include CVD and ALD. Exemplary CVD methods include thermal CVD, plasma enhanced CVD (PECVD), pulsed CVD (PCVD), low pressure CVD (LPCVD), sub-atmospheric CVD (SACVD) atmospheric pressure CVD (APCVD), hot-wire CVD (HWCVD, also known as cat-CVD, in which a hot wire serves as an energy source for the deposition process), radicals incorporated CVD, and combinations thereof. Exemplary ALD methods include thermal ALD, plasma enhanced ALD (PEALD), spatial ALD, hot-wire ALD (HWALD), radicals incorporated ALD, and combinations thereof, Super critical fluid deposition may also be used. The deposition method is preferably ALD, PE-ALD, spatial ALD in order to provide suitable step coverage and film thickness control.

The films deposited on the HAR structures using the disclosed inhibitor deposition methods may be metal films, metal oxide films, silicon-containing films, alloys, and so on. Exemplary film deposited on the HAR structures is $ZrO_2$.

With the suitable vapor deposition methods, the disclosed precursors and inhibitors may be supplied either in neat form in a blend with a suitable solvent, such as ethyl benzene, xylene, mesitylene, decalin, decane, dodecane. The disclosed precursors and inhibitors may be present in varying concentrations in the solvent. A neat blended precursor and a neat blended inhibitor may be introduced into a reactor, respectively, in a vapor form by conventional means, such as tubing and/or flow meters. The vapor form may be produced by vaporizing the neat blended precursor and inhibitor through a conventional vaporization step such as direct vaporization, distillation, by bubbling, or by using a sublimator. The neat blended precursor and inhibitor may be fed in a liquid state to a vaporizer where it is vaporized before it is introduced into the reactor. Alternatively, the neat blended precursor and inhibitor may be vaporized by passing a carrier gas into a container containing the composition by bubbling the carrier gas into the composition. The carrier gas may include, but is not limited to, Ar, He, $N_2$, and mixtures thereof. Bubbling with a carrier gas may also remove any dissolved oxygen present in the neat blended precursor and inhibitor. The carrier gas and precursor and the carrier gas and inhibitor are then introduced into the reactor as a vapor, respectively. Similarly, if a liquid co-reactant is used, the vapor form of the co-reactant will be produced in the same way as that of the precursor and inhibitor.

If necessary, the containers containing the disclosed precursor, inhibitor and co-reactant may be heated to a temperature that permits the precursor, inhibitor and co-reactant to be in their liquid phase and to have a sufficient vapor pressure. The container may be maintained at temperatures in the range of, for example, approximately 0° C. to approximately 200° C. Those skilled in the art recognize that the temperature of the container may be adjusted in a known manner to control the amount of precursor vaporized.

The reactor or reaction chamber may be any enclosure chamber within a device in which deposition methods take place such as without limitation, a parallel-plate type reactor, a cold-wall type reactor, a hot-wall type reactor, a single-wafer reactor, a multi-wafer reactor, other types of deposition systems under conditions suitable to cause the compounds to react and form the layers. One of ordinary skill in the art will recognize that any of these reactors may be used for either ALD or CVD deposition processes.

The reactor contains one more substrates onto which the films will be deposited. A substrate is generally defined as the material on which a process is conducted. The substrates may be any suitable substrate used in semiconductor, photovoltaic, flat panel, LCD-TFT device manufacturing. Examples of suitable substrates include wafers, such as silicon, silica, glass, GaAs wafers. The wafer may have one more layers of differing materials deposited on it from a previous manufacturing step. For example, the wafers may include a dielectric layer. Furthermore, the wafers may include silicon layers (crystalline, amorphous, porous, etc.), silicon oxide layers, silicon nitride layers, silicon oxy nitride layers, carbon doped silicon oxide (SiCOH) layers, metal, metal oxide metal nitride layers (Ti, Ru, Ta, etc.), and combinations thereof. Additionally, the wafers may include copper layers, noble metal layers (e.g., platinum, palladium, rhodium, gold). The wafers may include barrier layers, such as manganese, manganese oxide, etc. Plastic layers, such as poly(3,4-ethylenedioxythiophene)poly(styrenesulfonate) [PEDOT:PSS] may also be used. The layers may be planar or patterned. The patterned layers may be alternating layers of two specific layers such as $In_2O_3$ and $ZrO_2$ used in 3D NAND. The wafer may have one more apertures formed in it from a previous manufacturing step. The aperture may be a hole, via, trench, gap, etc. formed in the wafer or substrate. The aspect ratios of the aperture may range from approximately 5:1 to approximately 200:1. The disclosed methods may deposit a film directly on the aperture in the wafer. Furthermore, one of ordinary skill in the art will recognize that the terms "film" "layer" used herein refer to a thickness of some material laid on spread over a surface and that the surface may be a trench a line. Throughout the specification and claims, the wafer and any associated layers thereon are referred to as substrates.

The temperature and the pressure within the reactor or chamber are held at conditions suitable for vapor depositions, such as ALD and CVD. In other words, after introduction of the vaporized precursor, inhibitor and co-reactant into the reactor, conditions within the reactor are at least part of the precursor is deposited onto the substrate to form a layer. For instance, the pressure in the reactor or the deposition pressure may be held between about $10^{-3}$ Torr and about 100 Torr, more preferably between about $10^{-2}$ Torr and about 100 Torr, as required per the deposition parameters. The temperature of the reactor may be controlled by either controlling the temperature of the substrate holder controlling the temperature of the reactor wall. Devices used to heat the substrate are known in the art. The reactor wall is heated to a sufficient temperature to obtain the desired film at a sufficient growth rate and with desired physical state and composition. A non-limiting exemplary temperature range to which the reactor wall may be heated includes from room temperature to approximately 650° C. When a plasma deposition process is utilized, the reactor temperature may range from approximately 100° C. to approximately 500° C. Alternatively, when a thermal process is performed, the reactor temperature may range from approximately 100° C. to approximately 650° C.

Alternatively, the substrate may be heated to a sufficient temperature to obtain the desired film at a sufficient growth rate and with desired physical state and composition. A non-limiting exemplary temperature range to which the substrate may be heated includes from room temperature to approximately 650° C. Furthermore, one of ordinary skill in the art will recognize that the temperature of the reactor and the temperature of substrate will reach to an equilibrium temperature during the deposition process. Throughout the specification and claims, the reactor temperature and the substrate temperature refer to a deposition temperature. Thus, the deposition temperature of the disclosed methods ranges from room temperature to approximately 650° C. When a plasma deposition process is utilized, the deposition temperature may range from approximately 100° C. to approximately 500° C. Alternatively, when a thermal process is performed, the deposition temperature may range from approximately 100° C. to approximately 650° C.

The disclosed precursor, inhibitor and co-reactant may be introduced into the reactor either simultaneously (CVD) or sequentially (ALD) with various supplying orders of the inhibitor, the precursor and the co-reactant. The reactor may be purged with an inert gas (for example, $N_2$, Ar, Kr, Xe) between the introductions of the inhibitor, the precursor and the co-reactant. Alternatively, the inhibitor, the precursor and the co-reactant may be mixed together to form an inhibitor/precursor/co-reactant mixture, and then introduced to the reactor in a mixture form. Alternatively, the inhibitor and the precursor may be mixed together to form an inhibitor/precursor mixture introduced to the reactor in a mixture form and then a co-reactant is introduced to the reactor.

In the disclosed processes, the substrate exposure time may range from 0.1 second to 30 minutes, preferably, from 0.5 seconds to 10 minutes; the disclosed precursor exposure time may range from 0.1 second to 30 minutes, preferably, from 0.5 seconds to 10 minutes; the disclosed inhibitor exposure time may range from 0.1 second to 30 minutes, preferably, from 0.5 seconds to 10 minutes; the co-reactant exposure time may range from 0.1 second to 30 minutes, preferably, from 0.5 seconds to 10 minutes. In the disclosed processes, a dose of the inhibitor may be larger than a dose of the precursor and vice versa; a dose of the inhibitor may be larger than a dose of the co-reactant and vice versa.

Alternatively, the vaporized inhibitor, precursor and co-reactant may be simultaneously sprayed from different sectors of a shower head (without mixing of the inhibitor, precursor and the co-reactant) under which a susceptor holding several wafers is spun (spatial ALD).

Depending on particular process parameters, deposition may take place for a varying length of time. Generally, deposition may be allowed to continue as long as desired necessary to produce a film with necessary properties. Typical film thicknesses may vary from several angstroms to several hundreds of microns, and typically from 2 to 100 nm, depending on the specific deposition process. The deposition process may also be performed as many times (cycles) as necessary to obtain the desired film with an improved or a perfect step coverage (e.g., ≥100%). In some cases, by adding an inhibitor, the disclosed inhibitor deposition method may improve the step coverage over the cases that no inhibitors are applied, even though the targeted step coverage does not reach to a perfect step coverage (e.g., ≥100%).

In a non-limiting exemplary ALD process of forming a metal oxide film, a three-step process may be performed. First, the vapor phase of the disclosed inhibitor, such as, dimethoxyethane (DME), is introduced into the reactor, where it is physisorbed on the surface. Excess inhibitor may then be removed from the reactor by purging and/or evacuating the reactor, that is, either by purging a reactor with an inert gas (for example, $N_2$, Ar, Kr, Xe), or passing the substrate in a sector under high vacuum and/or a carrier gas curtain. Secondly, a precursor, such as $ZrCp(NMe_2)_3$, is introduced into the reactor where it is absorbed (chemisorbed and physisorbed as well) on the substrate. Excess precursor may then be removed from the reactor by purging the reactor using the inert gas and/or evacuating the reactor. Thirdly, a co-reactant (for example, $O_3$) is introduced into the reactor where it reacts with the adsorbed precursor to deposit a film on the surface in a self-limiting manner and reacts with the physisorbed inhibitor to remove it from the surface. After that, any excess co-reactant is removed from the reactor by purging and/or evacuating the reactor. If the desired film is an oxide, such as $ZrO_2$, this three-step process, i.e., inhibitor-precursor-co-reactant, may be repeated until a film having a necessary thickness and a desired step coverage has been obtained. Alternatively, the order of the inhibitor, the precursor and the co-reactant introduced to the reactor of this three-step process may vary. For example, precursor-inhibitor-co-reactant, inhibitor-co-reactant-precursor, and so on. This three-step process may provide a desired film thickness and film conformality.

Figure 1:
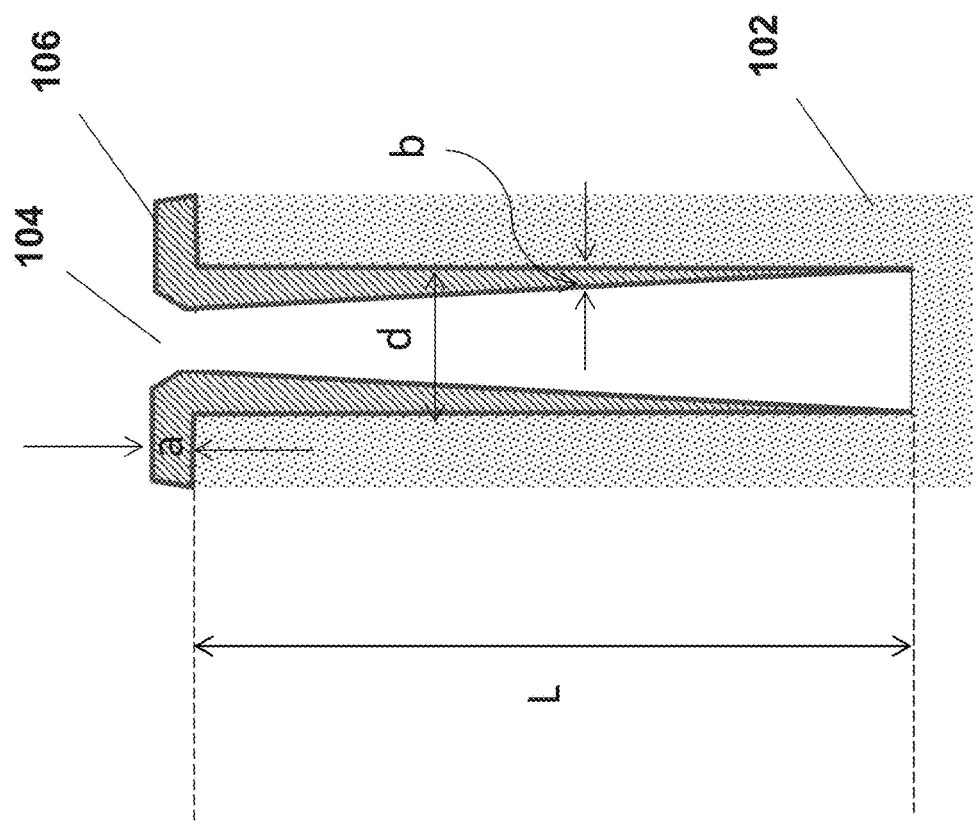
FIG. 1 is a schematic diagram showing a poor step coverage of a HAR aperture.

FIG. 1 is a schematic diagram showing a poor step coverage of a HAR aperture. A substrate 102 has an aperture 104 therein. A film 106 is deposited using a vapor deposition process, such as ALD, on the top and sidewall of the aperture 104. In this case, the film 106 is mainly deposited in the top part of the aperture and no film is deposited on the bottom of the aperture, because a deposition precursor could not access to the deep part of the aperture during a deposition process. The aperture 104 may be a hole, via, trench, gap, opening etc. formed in the substrate 102 from a previous manufacturing process. The aspect ratios of the aperture 104 may range from approximately 5:1 to approximately 200:1. Without using an inhibitor, the film 106 deposited on the aperture is not conformal. Here, step coverage is defined as b/a×100%; aspect ratio is defined as L/d. As shown, in this case, without using the inhibitor, b<a, therefore, the step coverage is less than 100%.

Figure 3B:
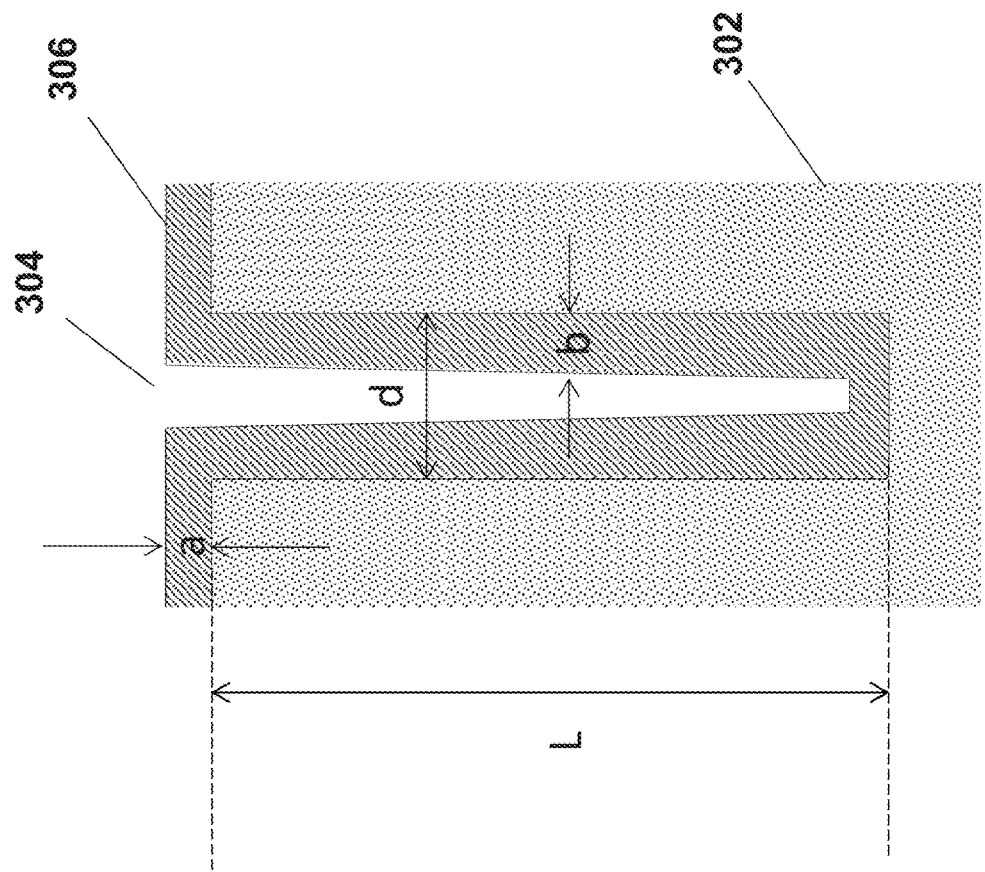
FIG. 3b is a schematic diagram showing a step coverage of >100% of a HAR aperture.
Figure 3A:
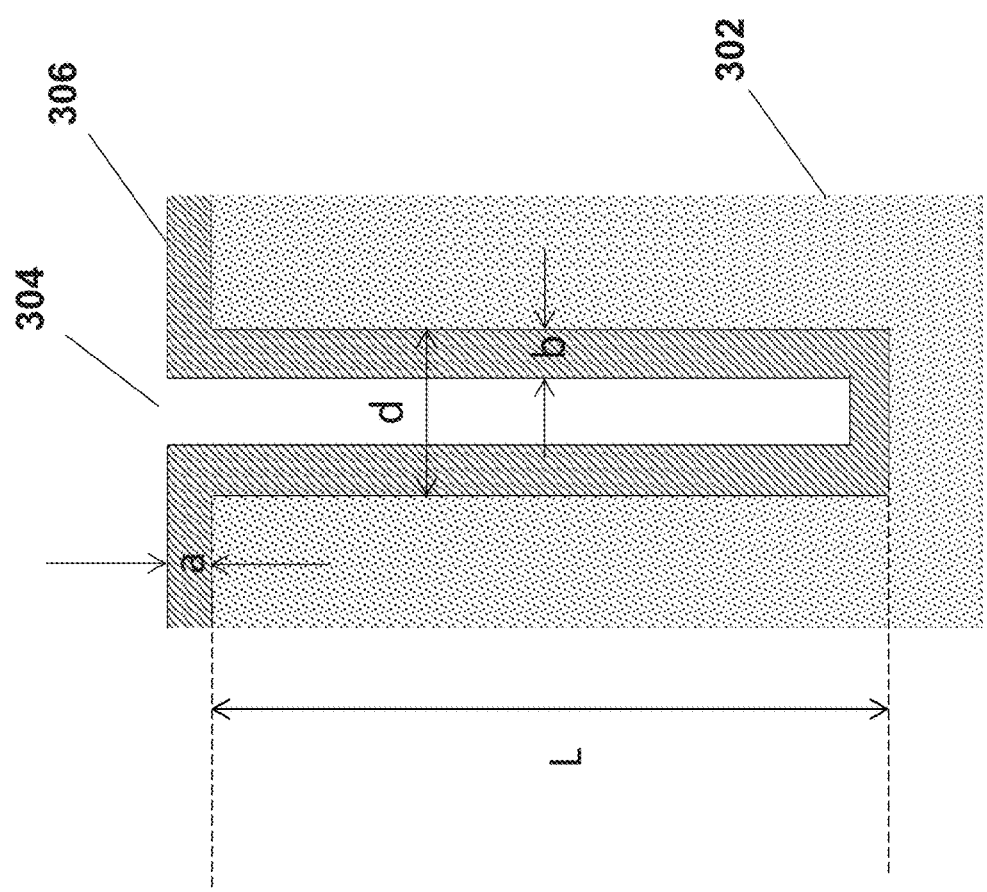
FIG. 3a is a schematic diagram showing a step coverage of 100% of a HAR aperture.

FIG. 2 is a schematic diagram showing the inhibitor effect on step coverage of a HAR aperture with an inhibitor according to the disclosed methods. The aperture 204 may be a hole, via, trench, gap, etc. formed in the substrate 202 from a previous manufacturing process. The aspect ratios of the aperture 204 may range from approximately 5:1 to approximately 200:1. An inhibitor adsorption layer (not shown) may form a vertical gradient of physisorption along the aperture, which has a high adsorption near to the top entrance of the aperture, a low adsorption deep at the bottom. With the inhibitor physisorbed thereon (not shown), an incoming deposition precursor may be able to access to the deeper part of the aperture and adsorb thereon. The deposition precursor adsorption includes physisorption and chemisorption. The inhibitor adsorption layer may compete with the incoming deposition precursor for active binding sites of the surface of the aperture, resulting in the deposition precursor adsorbed in the deep part of the aperture. The concentration of the precursor in the bottom of the aperture 204 is higher than the concentration of the precursor in the top portion of the aperture 204. An incoming co-reactant reacts with the adsorbed precursor, which forms a film 206 from the deep part of the aperture. Repeating this cycle more times, the film 206 is growing from the deep part of the aperture 204 to the top part of the aperture 204 and gradually reaches to the top entrance of the aperture. Eventually the film 206 is formed with a desired thickness and a perfect step coverage as shown in FIG. 3a, a schematic diagram showing a step coverage of 100% (b=a) of a HAR aperture, and FIG. 3b, a schematic diagram showing a step coverage of >100% (b>a) of a HAR aperture. Here, prior to exposing the aperture to the deposition precursor, a purge step using an inert gas (e.g., $N_2$, Ar, Kr, etc.) is performed to remove excess inhibitor. Prior to exposing the aperture to the co-reactant, a purge step is performed to remove excess deposition precursor. For next cycle, prior to exposing the aperture to the inhibitor, a purge step is performed to remove excess co-reactant. In this way, the disclosed inhibitor deposition methods are capable of producing a perfect step coverage, i.e., a step coverage of ≥100% on the apertures having an aspects ratio ranging from approximately 5:1 to approximately 200:1.

FIG. 4a to FIG. 4d are various exemplary timing diagrams of a method and order of supplying an inhibitor, a precursor and a co-reactant according to the disclosed methods, in which each of feed materials, i.e., the inhibitor, the precursor and the co-reactant, may be pulse-supplied. Flow rate and supplying times of the respective feed materials may not be proportional to the heights and widths of pulses shown in FIG. 4a to FIG. 4c.

Figure 4A:
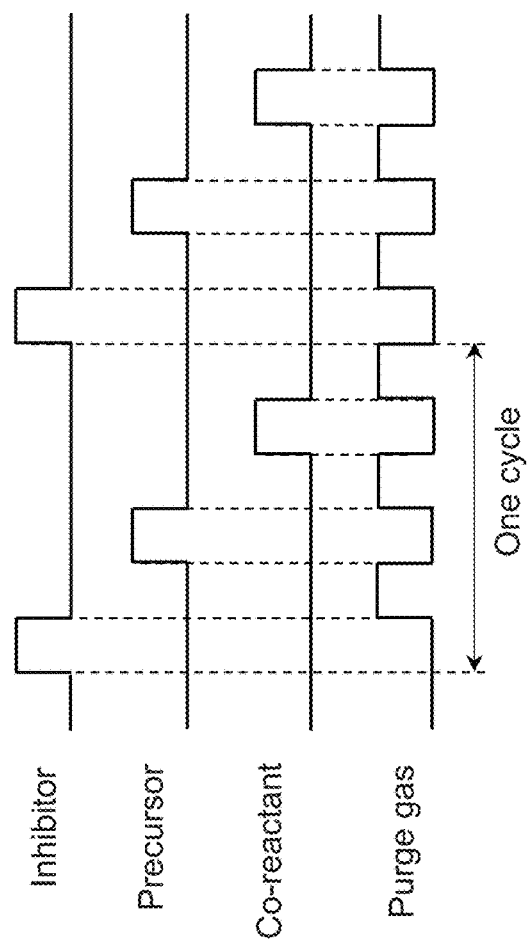
FIG. 4a is an exemplary timing diagram for an order of introducing an inhibitor, a precursor and a co-reactant according to the disclosed methods.

FIG. 4a refers to a three-step deposition process in a sequence of inhibitor-precursor-co-reactant. Although it described above in forming the metal oxide film, a more detailed description is described herein. When the inhibitor is introduced into a reactor, the inhibitor may be physisorbed on a surface of a substrate in the reactor. Then the reactor may be purged with a purge gas so that an excess amount of the inhibitor is removed and the physisorbed inhibitor may be left as a very thin layer, possibly one monolayer or less.

After that, a precursor is added. The precursor may be physisorbed and chemisorbed on the surface of apertures in the substrate while the chemisorption of the precursor on the substrate is being controlled by the physisorbed inhibitor layer. Since a substantial portion of the surface of apertures is covered with the inhibitor, the precursor may be physisorbed on the surface via the inhibitor. When the reactor is purged with the purge gas again, excess amount of the precursor is removed and an adsorption layer may be obtained by adsorbing the precursor on the surface. The adsorption layer may be in the level of a very thin layer, may be one monolayer or less. More specifically, in this way, excessive adsorption of the precursor may be considerably controlled at an entrance and the top portion of the apertures. The precursor is able to access to the deep part of the apertures.

Afterward, the co-reactant is introduced. The co-reactant may react with the adsorbed precursor to form a film, and react with the co-reactant to remove it. Then by purging, excessive amounts of the co-reactant and reaction byproducts may be removed from the reactor.

Figure 4B:
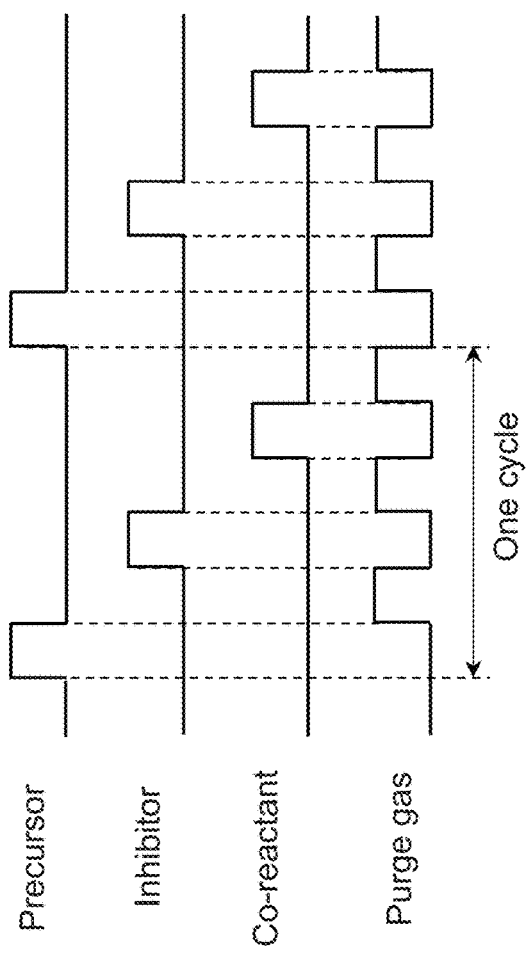
FIG. 4b is another exemplary timing diagram for an order of introducing an inhibitor, a precursor and a co-reactant according to the disclosed methods.

FIG. 4b refers to a three-step deposition process in a sequence of precursor-inhibitor-co-reactant. The precursor is first introduced into the reactor. The precursor may be adsorbed on the surface of the substrate. In this case, a considerable amount of precursor may be directly chemisorbed on the surface of the apertures in the substrate, while additional precursor may be physisorbed on the surface via the chemisorbed precursor. After that, by purging, the precursor physisorbed on the substrate may be partially removed, while some of the physisorbed precursor may still remain on the chemisorbed precursor. Since the physisorbed precursor is an excessively adsorbed source material, it may be necessary to remove the physisorbed precursor to form a conformal film. Thus, the inhibitor is added in the next step. The inhibitor may be combined with the precursor due to van der Waals attraction. More specifically, the inhibitor may be combined with the central atom of the precursor. The physisorbed precursor may be released due to this combination, and the excessively adsorbed precursor may be mostly removed. After that, by purging, the excessive inhibitor and the reaction byproducts may be removed from the reactor, and a layer at which the precursor is chemisorbed on the level of a very thin layer, one monolayer or less, may be obtained. The reaction byproducts may include a combination of the inhibitor with the precursor.

Subsequently, the co-reactant is introduced. The co-reactant may be reacted with the precursor that is chemisorbed in a monolayer state to form a film, and the inhibitor may be reacted with the co-reactant and removed. By purging, excessive amounts of co-reactant and the reaction byproducts may be removed from the reactor.

Figure 4C:
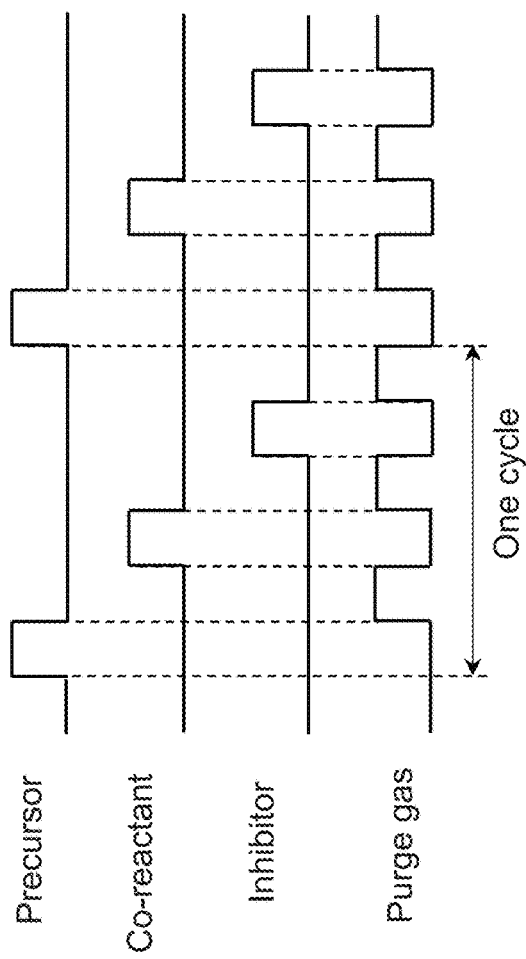
FIG. 4c is another exemplary timing diagram for an order of introducing an inhibitor, a precursor and a co-reactant according to the disclosed methods.

FIG. 4c refers to a three-step deposition process in a sequence of precursor-co-reactant-inhibitor. In this case, the precursor is added first and the precursor disposition on the surface of the apertures is the same as that in FIG. 4b. Next, after purging to remove excessive physisorbed precursor, the co-reactant is introduced. The co-reactant may be reacted with the precursor that is chemisorbed to form a film. Then, excessive amounts of the reaction byproducts may be removed from the reactor by purging. Subsequently, the inhibitor is introduced. The inhibitor may be adsorbed on the film and the chemisorbed precursor on the surface of the aperture. More specifically, the inhibitor may be combined with the central atom of the precursor. Since the inhibitor may form a vertical gradient adsorption along the aperture, high adsorption near to the top entrance, low adsorption deep at the bottom, the chemisorbed precursor may be released near the top entrance of the aperture due to this combination, and the excessively adsorbed precursor may be mostly removed by purging, and a layer at which the precursor is chemisorbed on the level of one monolayer or less may be obtained. The reaction byproducts may include a combination of the inhibitor with the precursor.

Figure 4D:
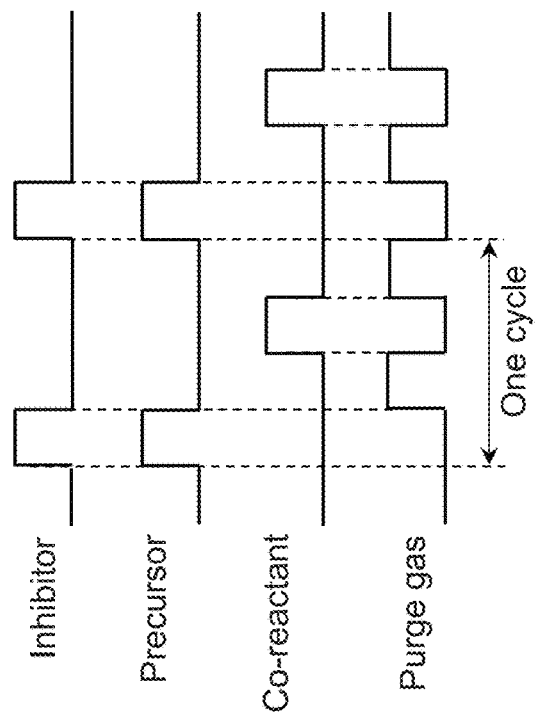
FIG. 4d is another exemplary timing diagram for an order of introducing an inhibitor, a precursor and a co-reactant according to the disclosed methods.

FIG. 4d refers to a deposition process that the inhibitor and the precursor are introduced simultaneously and afterward the co-reactant is added. The precursor may be combined with each other and form a dimer or trimer when simultaneously introduced to the reactor first. The dimer or trimer is then adsorbed on the surface of the aperture, more layers of the precursor may be excessively adsorbed. When the inhibitor and the precursor are simultaneously added, the inhibitor may diminish the precursors' propensity to form the dimer or trimer. Thus, the excessive adsorption of the precursor may be alleviated, especially near the entrance of the aperture. By purging, the excessive amounts of the precursor, the inhibitor and unnecessary byproducts may be removed from the reactor. Afterward, the co-reactant is added. The co-reactant may be reacted with the adsorbed precursor to form a film, and the inhibitor in the reactor may be reacted with the co-reactant and removed. By purging, the excessive amounts of the co-reactant and the reaction byproducts may be removed from the reactor.

The processes described with reference to FIG. 4a to FIG. 4d may be dynamically performed to prevent excessive adsorption of the precursor. By purging with a purging gas, excessive amounts of the precursor, the inhibitor and co-reactant may be removed from the reactor, and unnecessary byproducts may also be removed from the reactor.

The combination of the order and timing of the inhibitor, the precursor and the co-reactant introduced into the reactor is not limited to those shown in FIG. 4a to FIG. 4d. The disclosed inhibitor deposition methods include all possible combinations of the orders and timings of the inhibitor, the precursor and the co-reactant introduced into the reactor.

In a non-limiting exemplary ALD process, the disclosed ALD processes include i) supplying an inhibitor into a reactor that contains a substrate having apertures to be deposited wherein the inhibitor molecules are physisorbed on the surface of the aperture; ii) purging the inhibitor and removing excess inhibitor by a purge gas; iii) supplying a precursor into the reactor wherein the precursor molecules are adsorbed on the surface of the aperture; iv) purging the precursor and removing excess precursor by the purge gas; v) supplying a co-reactant into the reactor wherein the co-reactant reacts with the adsorbed precursor to form a film on the surface; vi) purging the co-reactant and removing byproducts and excess co-reactant by the purging gas; vii) repeating steps i) to vi) to achieve a desired thickness of the film deposited on the aperture. The deposited film produced by the disclosed deposition methods has an improved step coverage comparing to the film produced without using the inhibitor and has no voids and/or weakpoints as well.

Upon obtaining a desired film thickness and improved step coverage, the deposited film may be subject to further processing, such as thermal annealing, furnace-annealing, rapid thermal annealing, UV e-beam curing, and/or plasma gas exposure. Those skilled in the art recognize the systems and methods utilized to perform these additional processing steps. For example, the $ZrO_2$ film may be exposed to a temperature ranging from approximately 200° C. and approximately 100° C. for a time ranging from approximately 0.1 second to approximately 7200 seconds under an inert atmosphere or an O-containing atmosphere, combinations thereof. Most preferably, the temperature is 400° C. for 3600 seconds under an inert atmosphere or an O-containing atmosphere. The resulting film may contain fewer impurities and therefore may have an improved density resulting in improved leakage current. The annealing step may be performed in the same reaction chamber in which the deposition process is performed, or performed in a separate apparatus. Any of the above post-treatment methods, but especially thermal annealing, has been found effective to reduce carbon and nitrogen contamination of the $ZrO_2$ film. This in turn tends to improve the resistivity of the film.

EXAMPLES

The following non-limiting examples are provided to further illustrate embodiments of the invention. However, the examples are not intended to be all inclusive and are not intended to limit the scope of the inventions described herein.

Figure 5:
FIG. 5 is a SEM image showing about 60% of step coverage of an aspect ratio 20:1 aperture without an inhibitor.

Example 1: Step Coverage without Inhibitor in Case of ALD of $ZrO_2$ by $ZrCp(NMe_2)_3$ with Ozone The precursor vessel was heated at 80° C. $O_3$ was used as a co-oxidizing reactant and $ZrCp(NMe_2)_3$ was used as a precursor. A film of $ZrO_2$ was deposited on patterned wafers that have about 20:1 aspect ratio apertures through an ALD process. A reactor pressure was kept at around 1 Torr. Step coverage was tested with the same deposition conditions without the inhibitor in a temperature window of 200-400° C. on the patterned wafers that have about 20:1 aspect ratio apertures. FIG. 5 is a SEM image showing about 60% of step coverage of an aspect ratio 20:1 hole without an inhibitor.

Figure 6:
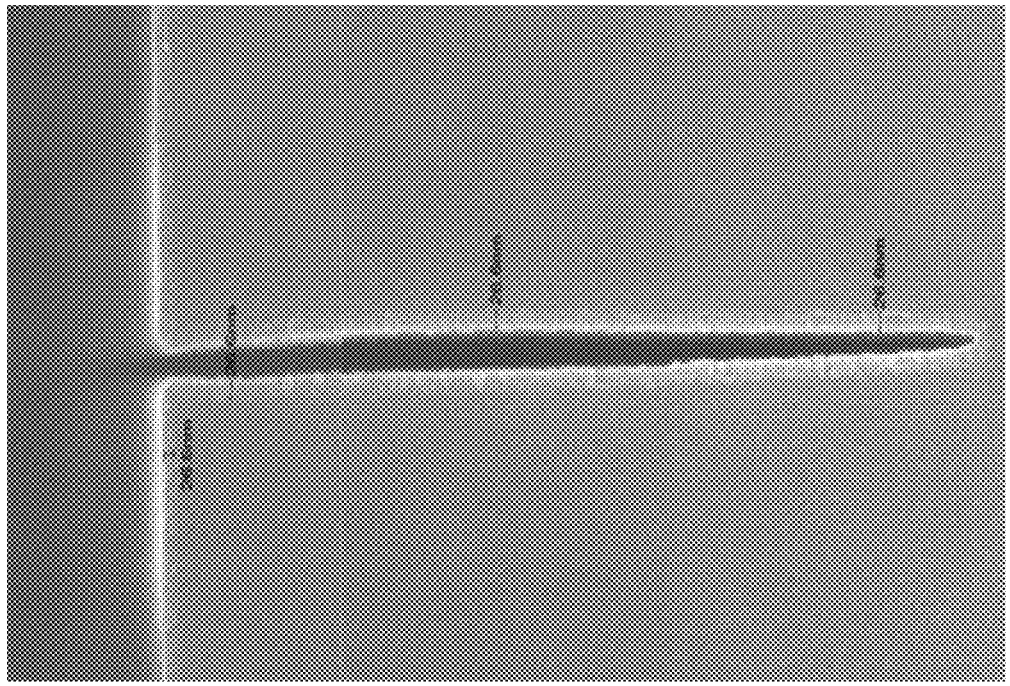
FIG. 6 is a SEM image showing about 100% of step coverage of an aspect ratio 25:1 aperture with the inhibitor dimethoxyethane (DME)

Example 2: Step Coverage with Inhibitor DME in Case of ALD of $ZrO_2$ by $ZrCp(NMe_2)_3$ with Ozone The precursor vessel was heated at 80° C. $O_3$ was used as a co-oxidizing reactant, DME was used as an inhibitor and $ZrCp(NMe_2)_3$ was used as a precursor. A film of $ZrO_2$ was deposited on patterned wafers that have about 25:1 aspect ratio apertures through an ALD process. A reactor pressure was kept at around 1 Torr. Step coverage was tested with the same deposition conditions with the inhibitor in a temperature window of 200-400° C. on patterned wafers, which have about 25:1 aspect ratio apertures. FIG. 6 is a SEM image showing about 100% of step coverage of an aspect ratio 25:1 hole with the inhibitor DME.

Figure 7:
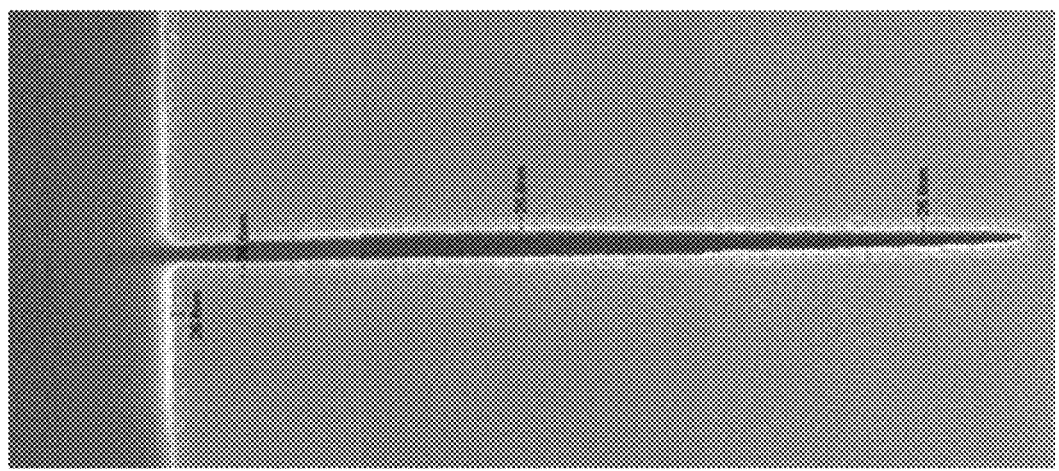
FIG. 7 is a SEM image showing about 100% of step coverage of an aspect ratio 25:1 aperture with the inhibitor triethylamine (TEA)

Example 3: Step Coverage with Inhibitor TEA in Case of ALD of $ZrO_2$ by $ZrCp(NMe_2)_3$ with Ozone The precursor vessel was heated at 80° C. $O_3$ was used as a co-oxidizing reactant, TEA as an inhibitor and $ZrCp(NMe_2)_3$ was used as a precursor. A film of $ZrO_2$ was deposited on patterned wafers that have about 25:1 aspect ratio apertures through an ALD process. A reactor pressure was kept at around 1 Torr. Step coverage was tested with the same deposition conditions with the inhibitor in a temperature window of 200-400° C. on patterned wafers, which have about 25:1 aspect ratio apertures. FIG. 7 is a SEM image showing about 100% of step coverage of an aspect ratio 25:1 hole with the inhibitor TEA.

Figure 8:
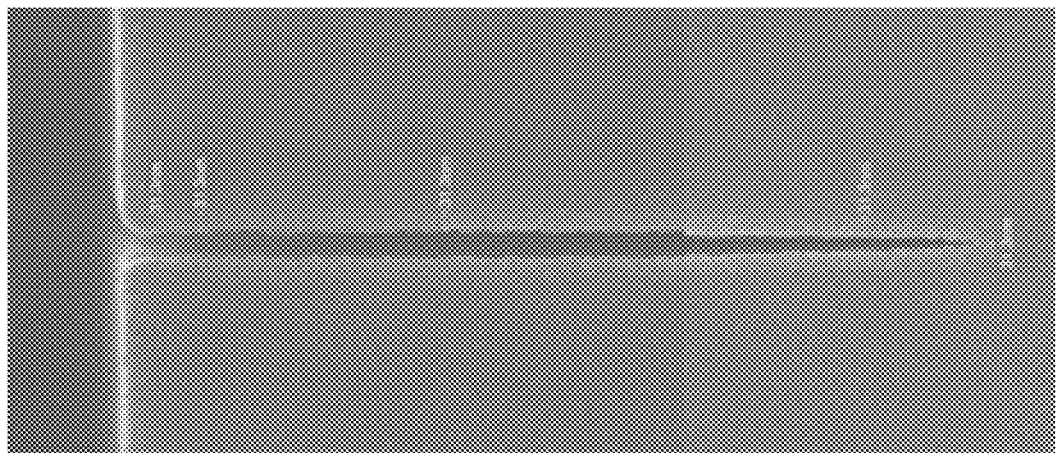
FIG. 8 is a SEM image showing about 100% of step coverage of an aspect ratio 20:1 hole with the inhibitor tetrahydrofuran (THF).

Example 4: Step Coverage with Inhibitor THF in Case of ALD of $ZrO_2$ by $ZrCp(NMe_2)_3$ with Ozone The precursor vessel was heated at 80° C. $O_3$ was used as a co-reactant, THF was used as an inhibitor and $ZrCp(NMe_2)_3$ was used as a precursor. A film of $ZrO_2$ was deposited on patterned wafers that have about 25:1 aspect ratio apertures through an ALD process. A reactor pressure fixed was kept at around 1 Torr. Step coverage was tested with the same deposition conditions with the inhibitor in a temperature window of 200-400° C. on patterned wafers, which have about 20:1 aspect ratio apertures. FIG. 8 is a SEM image showing about 100% of step coverage of an aspect ratio 20:1 hole with the inhibitor THF.

Example 5: ALD of Inhibitor Dose

The ALD process was done at 300° C. $O_3$ was used as a co-oxidizing reactant and tetrahydrofuran (THF) as an inhibitor. A reactor pressure was kept at around 1 Torr. The partial pressure of THF was 0.3 Torr. The aspect ratio of the apertures was 25:1 and the critical dimension (CD) was 100 nm in a layer of $SiO_2$. The ALD process was performed with i) 5 second THF flow and 30 second purge; ii) 1 second precursor flow and 30 second purge; and iii) 1 second co-reactant flow and 30 second purge; repeatedly.

It will be understood that many additional changes in the details, materials, steps, and arrangement of parts, which have been herein described and illustrated in order to explain the nature of the invention, may be made by those skilled in the art within the principle and scope of the invention as expressed in the appended claims. Thus, the present invention is not intended to be limited to the specific embodiments in the examples given above and/or the attached drawings.

While embodiments of this invention have been shown and described, modifications thereof may be made by one skilled in the art without departing from the spirit or teaching of this invention. The embodiments described herein are exemplary only and not limiting. Many variations and modifications of the composition and method are possible and within the scope of the invention. Accordingly, the scope of protection is not limited to the embodiments described herein, but is only limited by the claims which follow, the scope of which shall include all equivalents of the subject matter of the claims.

What is claimed is:

1. A method for improving step coverage of a film deposited on high aspect ratio (HAR) apertures in a substrate, the method comprising:
   i) sequentially or simultaneously exposing the substrate to a vapor of an inhibitor, a vapor of a precursor ZrCp $(NMe_2)_3$ and a vapor of a co-reactant; and
   ii) allowing the film with a desired step coverage being deposited on the surface of the HAR apertures through a vapor deposition process,
   wherein the inhibitor is selected from one or more of
   a) phosphorus based aliphatic and aromatic inhibitors;
   b) boron based aliphatic and aromatic inhibitors;
   c) $H_2O$ vapor, $H_2$ gas, CO gas, CS gas and nitrogen oxide ($NO_x$) gases; and
   d) combinations of a)-c).

2. The method of claim 1, further comprising maintaining a temperature of the substrate in a range of from room temperature to 650° C.

3. The method of claim 1, wherein the inhibitor is selected from one or more of
   a. diols, ethers, epoxides, aldehydes, ketones, carboxylic acids, enols, esters, anhydrides, phenols, substituted phenols;
   b. amines, imines, imides, azides, cyanates, nitrile, nitrate, nitrite, nitrogen containing heterocycles;
   c. thiols, sulfides, disulfide, sulfonxide, thiocyanates, isothiocyanates, thioesters;
   d. phosphines, phosphonic acid, phosphodiesters;
   e. boronic acid, boronic ester, borinic esters; carbon based aliphatic inhibitors including alkanes, alkenes, alkynes and benzene derivatives;
   f. $I_2$;
   g. or combinations of a)-f).

4. The method of claim 3, wherein the inhibitor is a radical form of a vapor or gas of the inhibitor at a temperature ranging from room temperature to approximately 650° C. generated with or without plasma.

5. The method of claim 1, wherein the co-reactant is $O_3$, $O_2$, $H_2O$, $H_2O_2$, $D_2O$, alcohols, $NH_3$, $N_2$, $N_2H_2$, $H_2$, or radicals thereof generated by plasma.

6. The method of claim 1, wherein the co-reactant is $O_3$ or $O_3$ radicals generated by plasma.

7. The method of claim 1, wherein the desired step coverage is ≥100%.

8. The method of claim 1, wherein the desired step coverage is larger than the step coverage with the absence of the inhibitor.

9. The method of claim 1, wherein the HAR ranges from 25:1 to 200:1.

10. The method of claim 1, wherein the substrate is a patterned or 3D structure.

11. The method of claim 1, wherein the aperture is a hole, a via, a trench, a gap or an opening formed in the substrate from a previous manufacturing step.

12. The method of claim 1, wherein the vapor deposition process is ALD, CVD or combination thereof.

13. The method of claim 1, wherein the vapor deposition process is a plasma enhanced CVD selected from a spatial ALD, a thermal ALD, or a plasma enhanced ALD.

14. The method of claim 1, wherein an order of exposing the substrate to the inhibitor, the precursor and the co-reactant includes
   i) the inhibitor, the precursor and the co-reactant sequentially;
   ii) the precursor, the inhibitor and the co-reactant sequentially;
   iii) the precursor, the co-reactant and the inhibitor sequentially; or
   iv) the inhibitor and the precursor simultaneously and then the co-reactant.

15. The method of claim 14, further comprising
purging and removing one or more of an excess inhibitor, an excess precursor and an excess co-reactant after each exposure using a purge gas,
wherein the purge gas is an inert gas selected from $N_2$, Ar, Kr or combinations thereof.

* * * * *